US011882696B2

(12) United States Patent
Choi et al.

(10) Patent No.: US 11,882,696 B2
(45) Date of Patent: Jan. 23, 2024

(54) ONE-TIME PROGRAMMABLE (OTP) MEMORY DEVICE AND METHOD OF OPERATING AN OTP MEMORY DEVICE

(71) Applicant: Samsung Electronics Co., Ltd., Suwon-si (KR)

(72) Inventors: Hoonsung Choi, Seoul (KR); Jinwoo Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 111 days.

(21) Appl. No.: 17/558,884

(22) Filed: Dec. 22, 2021

(65) Prior Publication Data

US 2022/0375948 A1  Nov. 24, 2022

(30) Foreign Application Priority Data

May 20, 2021 (KR) .................. 10-2021-0064624

(51) Int. Cl.
  *G11C 17/16* (2006.01)
  *H10B 20/20* (2023.01)
  *G11C 17/14* (2006.01)
  *G11C 17/18* (2006.01)

(52) U.S. Cl.
  CPC ........... *H10B 20/20* (2023.02); *G11C 17/146* (2013.01); *G11C 17/16* (2013.01); *G11C 17/18* (2013.01)

(58) Field of Classification Search
  CPC ................................ H10B 20/20; G11C 17/16
  USPC ........................................................ 365/201
  See application file for complete search history.

(56) References Cited

U.S. PATENT DOCUMENTS

| | | | |
|---|---|---|---|
| 8,722,496 B1 * | 5/2014 | Roizin | H01L 29/66833 438/257 |
| 9,379,028 B2 | 6/2016 | Cai et al. | |
| 9,704,569 B1 | 7/2017 | Ning et al. | |
| 9,887,201 B2 | 2/2018 | Luan | |
| 10,127,993 B2 | 11/2018 | Chung et al. | |
| 10,529,436 B1 | 1/2020 | Sargsyan et al. | |
| 10,559,691 B2 | 2/2020 | Toh et al. | |
| 10,720,513 B2 | 7/2020 | Toh et al. | |
| 2006/0244099 A1 * | 11/2006 | Kurjanowicz | H01L 21/28211 257/E21.666 |
| 2013/0161761 A1 | 6/2013 | Luan et al. | |

(Continued)

FOREIGN PATENT DOCUMENTS

CN  101740569 A  6/2010

*Primary Examiner* — Muna A Techane
(74) *Attorney, Agent, or Firm* — Muir Patent Law, PLLC

(57) ABSTRACT

A one-time programmable (OTP) memory device includes an access transistor, a word line, a voltage line, a well, a first filling oxide layer, a first semiconductor layer, and a bit line. The access transistor includes a gate structure on a substrate, and first and second impurity regions at portions of the substrate adjacent to the gate structure. The word line is electrically connected to the gate structure. The voltage line is electrically connected to the first impurity region. The well is formed at an upper portion of the substrate, and is doped with impurities having a first conductivity type. The first filling oxide layer is formed on the well. The first semiconductor layer is formed on the first filling oxide layer, and is doped with impurities having the first conductivity type and electrically connected to the second impurity region. The bit line is electrically connected to the well.

8 Claims, 9 Drawing Sheets

(56) References Cited

U.S. PATENT DOCUMENTS

| | | | |
|---|---|---|---|
| 2016/0013193 A1* | 1/2016 | Wu | G11C 16/08 |
| | | | 365/96 |
| 2018/0269209 A1* | 9/2018 | Tan | H01L 29/42328 |
| 2019/0067304 A1 | 2/2019 | Hall | |
| 2020/0295161 A1 | 9/2020 | Toh et al. | |

* cited by examiner

ONE-TIME PROGRAMMABLE (OTP) MEMORY DEVICE AND METHOD OF OPERATING AN OTP MEMORY DEVICE

CROSS-REFERENCE TO RELATED APPLICATION(S)

This application claims priority under 35 U.S.C. § 119 to Korean Patent Application No. 10-2021-0064624, filed on May 20, 2021 in the Korean Intellectual Property Office (KIPO), the disclosure of which is incorporated by reference herein in its entirety.

BACKGROUND

1. Technical Field

Example embodiments of the inventive concept relate to a semiconductor integrated circuit, more particularly, a one-time programmable (OTP) memory device and a method of operating the OTP memory device.

2. Discussion of Related Art

In a one-time programmable (OTP) memory device, data may be stored using a plurality of OTP cells each of which may have an un-programmed state and a programmed state. Data programmed in an OTP cell may be retained in the absence of power, and a programmed OTP cell may be in an irreversible state in which the programmed OTP cell cannot be re-programmed again. The OTP cell may include a fuse or an anti-fuse, and may be electrically programmed by breaking down a gate insulation layer included in the OTP cell through a high voltage.

Each of the OTP cells may store one bit data therein, and if data stored in each of the OTP cells increases, the size of the OTP memory device including the OTP cells may decrease.

SUMMARY

Example embodiments of the inventive concept provide a one-time programmable (OTP) memory device having enhanced electrical characteristics.

Example embodiments of the inventive concept provide a method of operating a one-time programmable (OTP) memory device having enhanced electrical characteristics.

According to example embodiments of the inventive concept, there is a one-time programmable (OTP) memory device. The OTP memory device may include an access transistor, a word line, a voltage line, a first well, a first filling oxide layer, a first semiconductor layer, and a bit line. The access transistor may include a gate structure on a substrate, and first and second impurity regions at respective portions of the substrate adjacent to the gate structure. The word line may be electrically connected to the gate structure. The voltage line may be electrically connected to the first impurity region. The first well may be formed at an upper portion of the substrate, and may be doped with impurities having a first conductivity type. The first filling oxide layer may be formed on the first well. The first semiconductor layer may be formed on the first filling oxide layer, and may be doped with impurities having the first conductivity type and electrically connected to the second impurity region. The bit line may be electrically connected to the first well.

According to example embodiments of the inventive concept, there is a one-time programmable (OTP) memory device. The OTP memory device may include an access transistor, a first well, a first filling oxide layer, a first semiconductor layer, an anti-fuse, a word line, a bit line, a voltage line, and a sensing line. The access transistor may include a first gate structure on a substrate and first and second impurity regions at respective portions of the substrate adjacent to the first gate structure. The first well may be formed at an upper portion of the substrate, and may be doped with impurities having a first conductivity type. The first filling oxide layer may be formed on the first well. The first semiconductor layer may be formed on the first filling oxide layer, and at least a portion of the first semiconductor layer may be doped with impurities having the first conductivity type. The anti-fuse may include a second gate structure on the first semiconductor layer and third and fourth impurity regions at respective portions of the first semiconductor layer adjacent to the second gate structure. The word line may be electrically connected to the first gate structure. The bit line may be electrically connected to the first impurity region. The voltage line may be electrically connected to the fourth impurity region. The sensing line may be electrically connected to the first well. The second gate structure and the second impurity region may be electrically connected to each other.

According to example embodiments of the inventive concept, there is a one-time programmable (OTP) memory device. The OTP memory device may include an access transistor and an anti-fuse. The access transistor may include a gate structure on a substrate and a source region and a drain region at respective portions of the substrate adjacent to the gate structure. The anti-fuse may be electrically connected to the source region. The anti-fuse may include an n-type well doped with n-type impurities at an upper portion of the substrate, a filling oxide layer on the n-type well, and a semiconductor layer doped with n-type impurities on the filling oxide layer and electrically connected to the source region.

According to example embodiments of the inventive concept, there is a one-time programmable (OTP) memory device. The OTP memory device may include an access transistor, a first anti-fuse, and a second anti-fuse. The access transistor may include a first gate structure on a substrate and first and second impurity regions at respective portions of the substrate adjacent to the first gate structure. The first anti-fuse may be electrically connected to the second impurity region, and may include a second gate structure on the substrate and third and fourth impurity regions at respective portions of the substrate adjacent to the second gate structure. The second anti-fuse may be formed on the substrate, and may include a filling oxide layer disposed between and electrically connected to an n-type well doped with n-type impurities at an upper portion of the substrate and the fourth impurity region.

According to example embodiments of the inventive concept, there is a method of operating a one-time programmable (OTP) memory device including an OTP memory cell, which may include an access transistor including a gate structure on a substrate, and a source region and a drain region at respective portions of the substrate adjacent to the gate structure, and may include an anti-fuse electrically connected to the source region and including an n-type well doped with n-type impurities at an upper portion of the substrate, a filling oxide layer on the n-type well, and a semiconductor layer doped with n-type impurities on the filling oxide layer and electrically connected to the source region. In the method, the OTP memory cell may be programmed by applying a selection voltage higher than a threshold voltage of the access transistor to the gate structure, applying a program voltage higher than a breakdown voltage of the anti-fuse to the drain region, and applying a program permit voltage lower than the program voltage to the n-type well.

According to example embodiments of the inventive concept, there is a method of operating a one-time programmable (OTP) memory device including an OTP memory cell, which may include an access transistor including a first gate structure on a substrate and first and second impurity regions at respective portions of the substrate adjacent to the first gate structure, may include a first anti-fuse including a second gate structure electrically connected to the second impurity region on the substrate, and third and fourth impurity regions at respective portions of the substrate adjacent to the second gate structure, and may include a second anti-fuse including a filling oxide layer disposed between an n-type well doped with n-type impurities and the fourth impurity region. In the method, the OTP memory cell may be programmed by applying a selection voltage higher than a threshold voltage of the access transistor to the first gate structure, applying a program voltage higher than a breakdown voltage of the first anti-fuse and/or the second anti-fuse to the fourth impurity region, applying a program permit voltage lower than the program voltage to the first impurity region and/or the n-type well, and applying a program inhibit voltage higher than the program permit voltage to the first impurity region or the n-type well.

In the OTP memory device, the filling oxide layer included in an SOI substrate may serve as an anti-fuse, and thus more data may be stored when compared to the conventional OTP memory device using only the gate insulation pattern as an anti-fuse, so that the OTP memory device may have enhanced integration degree.

DETAILED DESCRIPTION OF THE EMBODIMENTS

The above and other features of the inventive concept will be more clearly understood by describing in detail exemplary embodiments thereof with reference to the accompanying drawings.

It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

Figure 1:
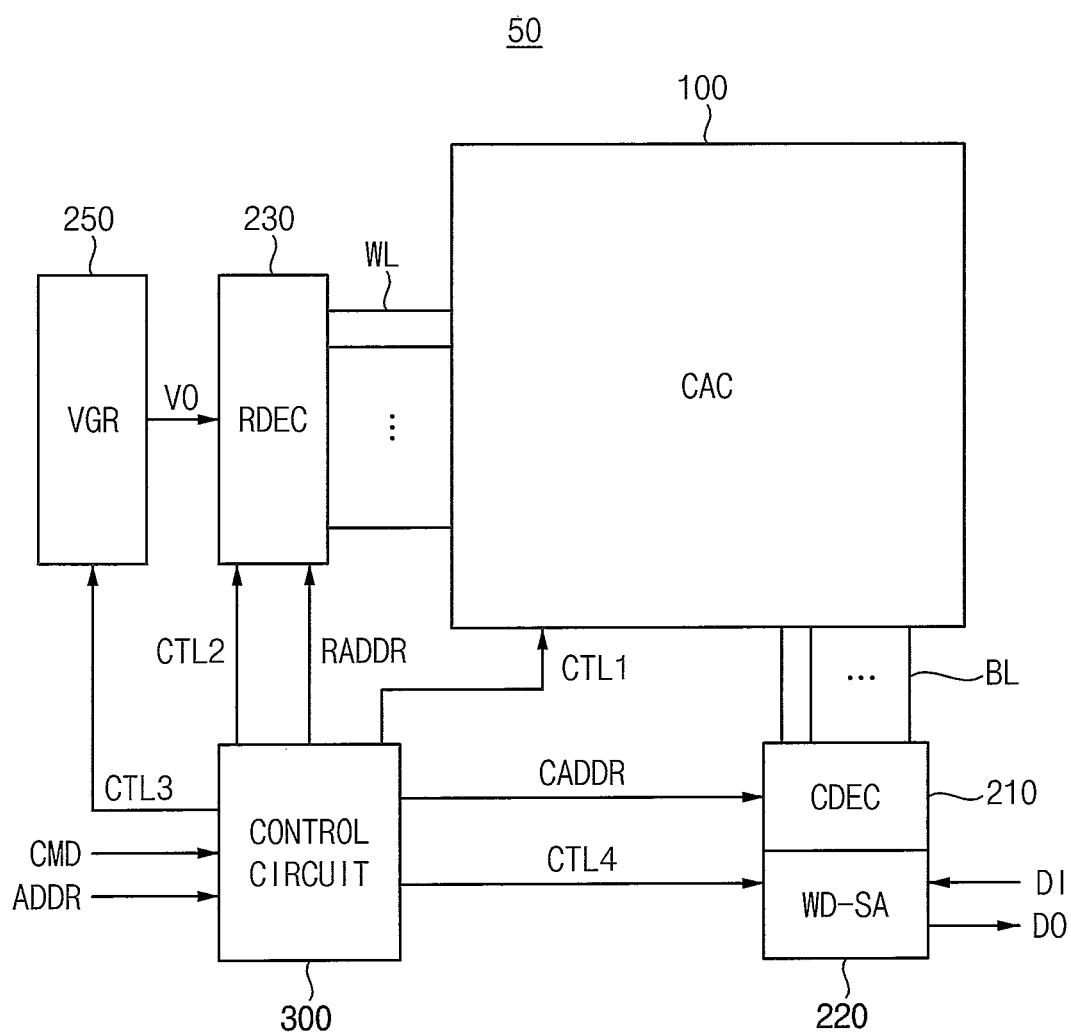
FIG. 1 is a block diagram illustrating an OTP memory device in accordance with example embodiments of the inventive concept.

FIG. 1 is a block diagram illustrating an OTP memory device in accordance with example embodiments of the inventive concept.

Referring to FIG. 1, an OTP memory device 50 may include a cell array circuit (CAC) 100, a column decoder (CDEC) 210, a write-sensing circuit (WD-SA) 220, a row decoder (RDEC) 230, a voltage generator (VGR) 250, and a control circuit 300.

The cell array circuit 100 may include an OTP cell array having a plurality of OTP memory cells coupled to a plurality of bit lines BL and a plurality of word lines WL.

The control circuit 300 may control a write operation and a read operation of the OTP memory device 50 based on a command CMD and an address ADDR received from an outside of the OTP memory device 50. The control circuit 300 may generate a first control signal CTL1 to control the cell array circuit 100, a second control signal CTL2 to control the row decoder 230, a third control signal CTL3 to control the voltage generator 250 and a fourth control signal CTL4 to control the write-sensing circuit 220 based on the command CMD. In addition, the control circuit 300 may generate a row address RADDR and a column address CADDR based on the address ADDR, and may provide the row address RADDR and the column address CADDR to the row decoder 230 and the column decoder 210, respectively.

The column decoder 210 may be coupled to the cell array circuit 100 through the bit lines BL. The column decoder 210 may determine one or more bit lines BL as selected bit lines based on the column address CADDR provided from the control circuit 300, and the others of the bit lines BL may be determined as unselected bit lines.

The write-sensing circuit 220 may be coupled to the column decoder 210, and may write input data DI in the cell array circuit 100 through the column decoder 210 and read output data DO from the cell array circuit 100 through the column decoder 210 to provide the output data DO to an outside. The write-sensing circuit 220 may include a write driver and a sense amplifier. The write driver may perform a write operation of storing write data in the OTP memory cells. The sense amplifier may perform a read operation of sensing the data stored in the OTP memory cells and providing read data to the outside. The write driver and the sense amplifier may be formed in the same circuit or device, or may be formed in separate circuits or devices.

The row decoder 230 may be coupled to the cell array circuit 100 through the word lines WL. The row decoder 230 may determine one or more word lines WL as selected word lines based on the row address RADDR provided from the control circuit 300, and the others of the word lines WL may determine as unselected word lines.

The voltage generator 250 may generate operating voltages VO under the control of the control circuit 300, and may provide the operating voltages VO to the word lines WL through the row decoder 230.

Figure 2:
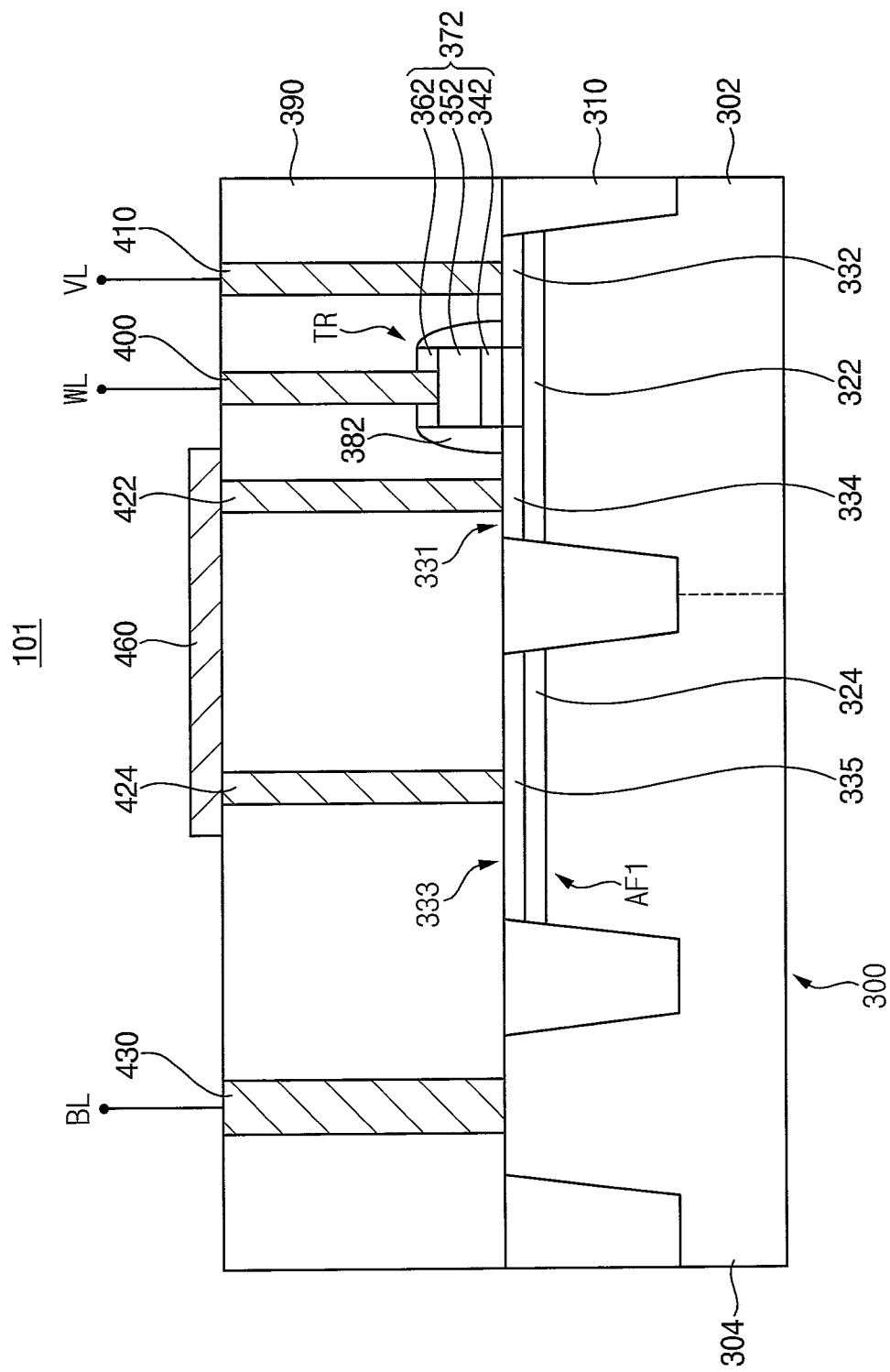
FIG. 2 is a cross-sectional view illustrating an OTP memory cell in accordance with example embodiments.
Figure 3:
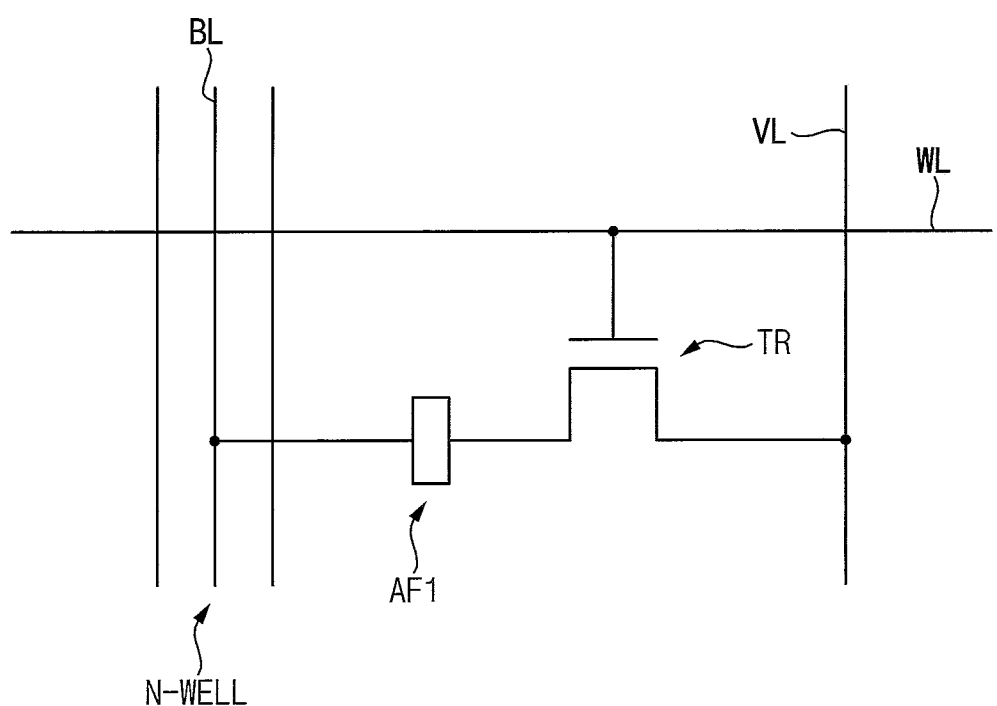
FIG. 3 is a circuit diagram illustrating an electrical connection relationship and an operating method of the OPT memory cell in accordance with example embodiments.

FIG. 2 is a cross-sectional view illustrating an OTP memory cell 101 in accordance with example embodiments, and FIG. 3 is a circuit diagram illustrating an electrical connection relationship and an operating method of the OPT memory cell 101 in accordance with example embodiments.

The OTP memory cell 101 may be a part of the OTP memory cell array included in the cell array circuit 100 illustrated with reference to FIG. 1.

Referring to FIG. 2, the OTP memory cell 101 may be formed on a substrate 300, and may include an access transistor TR and a first anti-fuse AF1.

In example embodiments, the substrate 300 may be a silicon-on-illustrator (SOI) substrate. Alternatively, the substrate 300 may be a germanium-on-illustrator (GOI) substrate.

First and second wells 302 and 304 may be formed in the substrate 300. In example embodiments, the first well 302 may be a p-type well (P-WELL) doped with p-type impurities, and the second well 304 may be an n-type well (N-WELL) doped with n-type impurities. Upper portions of the first and second wells 302 and 304 may be divided by an isolation pattern 310 on the substrate 300.

The isolation pattern 310 may be formed of or include an oxide, e.g., silicon oxide. The isolation pattern 310 may divide the upper portions of the first and second wells 302 and 304 from each other, and may also divide the upper portion of the second well 304 into a plurality of pieces.

A first filling oxide layer 322 and a first semiconductor layer 331 may be sequentially stacked on the first well 302. The first filling oxide layer 322 may be formed of or include an oxide, e.g., silicon oxide, and the first semiconductor layer 331 may be formed of or include crystalline silicon, e.g., single crystalline silicon or polysilicon. For example, the first semiconductor layer 331 of the access transistor TR may be formed on the first filling oxide layer 322.

A second filling oxide layer 324 and a second semiconductor layer 333 may be sequentially stacked on a portion of the second well 304, and the second filling oxide layer 324 and the second semiconductor layer 333 may not be formed on another portion of the second well 304.

In example embodiments, the first and second filling oxide layers 322 and 324 may have the same thickness, and the first and second semiconductor layers 331 and 333 may have the same thickness.

The access transistor TR may include the first semiconductor layer 331 and a first gate structure 372 on the first semiconductor layer 331. In an example embodiment, the access transistor TR may be formed on an SOI substrate in the OTP memory cell 101.

The first gate structure 372 may include a first gate insulation pattern 342, a first gate electrode 352 and a first gate mask 362 sequentially stacked, and a first spacer 382 may be formed on a sidewall of the first gate structure 372. The first gate electrode 352 may serve as a gate of the access transistor TR.

In example embodiments, the first gate insulation pattern 342 may have the same thickness as the first and second filling oxide layers 322 and 324, however, the inventive concept may not be limited thereto. For example, a thickness of the first gate insulation pattern 342 may be different from a thickness of each of the first and second filling oxide layers 322 and 324.

The first gate insulation pattern 342 may be formed of or include an oxide, e.g., silicon oxide, the first gate electrode 352 may be formed of or include a conductive material, e.g., doped polysilicon, a metal, a metal nitride, a metal silicide, etc., and the first and second gate mask 362 and the first spacer 382 may be formed of or include a nitride, e.g., silicon nitride.

Portions of the first semiconductor layer 331 at opposite sides of the first gate structure 372 may be doped with impurities having the same conductivity type as those included in the second well 304, that is, n-type impurities to form first and second impurity regions 332 and 334 each of which may serve as a source/drain region of the access transistor TR.

Additionally, at least a portion of the second semiconductor layer 333 may be doped with impurities having the same conductivity type as those included in the second well 304, that is, n-type impurities to form a third impurity region 335.

In example embodiments, the first anti-fuse AF1 may include the second filling oxide layer 324 between the second well 304 and the third impurity region 335. Alternatively, the first anti-fuse AF1 may be defined to include the third impurity region 335 and the second well 304 as well as the second filling oxide layer 324.

An insulating interlayer 390 may be formed on the substrate 300 having the first and second filling oxide layers 322 and 324 and the first and second semiconductor layers 331 and 333 thereon to cover the first gate structure 372 and the first spacer 382. The insulating interlayer 390 may be formed of or include an oxide, e.g., silicon oxide.

A first contact plug 400 extending through the insulating interlayer 390 and the first gate mask 362 to contact an upper surface of the first gate electrode 352, second and third contact plugs 410 and 422 extending through the insulating interlayer 390 to contact upper surfaces of the first and second impurity regions 332 and 334, respectively, a fourth contact plug 424 extending through the insulating interlayer 390 to contact an upper surface of the third impurity region 335, and a fifth contact plug 430 extending through the insulating interlayer 390 to contact an upper surface of a portion of the second well 304 on which the second filling oxide layer 324 and the second semiconductor layer 333 are not stacked. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. A wiring line 460 may be formed on the third and fourth contact plugs 422 and 424, and may electrically connect the third and fourth contact plugs 422 and 424 to each other.

The first to fifth contact plugs 400, 410, 422, 424 and 430 and the wiring line 460 may be formed of or include a conductive material, e.g., a metal, a metal nitride, a metal silicon and/or doped polysilicon.

Referring to FIG. 3 together with FIG. 2, the first contact plug 400 contacting the first gate electrode 352 may be electrically connected to a word line WL, the second contact plug 410 contacting the first impurity region 332 may be electrically connected to a voltage line VL, and the fifth contact plug 430 contacting the second well (N-WELL) 304 may be electrically connected to a bit line BL.

Thus, the first gate electrode 352 of the access transistor TR may be connected to the word line WL, and the drain region 332 of the access transistor TR may be connected to the voltage line VL. Additionally, the source region 334 of the access transistor TR may be connected to the third impurity region 335 on the second well 304, the third impurity region 335 and the second well 304 may be connected to each other by the first anti-fuse AF1 having the second filling oxide layer 324, and the second well 304 may be connected to the bit line BL.

Hereinafter, an operating method of the OTP memory cell 101 will be illustrated.

In a program mode (or a program operation), a program voltage having a voltage level higher than a voltage level that may break down the second filling oxide layer 324 on the second well 304, that is, a breakdown voltage of the first anti-fuse AF1 may be applied to the voltage line VL, and a selection voltage having a voltage level higher than a voltage level that may turn on the access transistor TR according to the row address RADDR generated by the row decoder 230 illustrated in FIG. 1, that is, a threshold voltage of the access transistor TR may be applied to the word line WL. A program permit voltage may be applied to one of the bit lines BL connected to one of OTP memory cells to be programmed, and a program inhibit voltage, which may be greater than the program permit voltage, may be applied to other ones of the bit lines BL connected to other ones of the OTP memory cells not to be programmed.

For example, each of the program voltage and the selection voltage may be 3V, the program permit voltage may be a ground voltage or 0V, and the program inhibit voltage may be 3V. However, the inventive concept may not be limited thereto, and the program voltage, the selection voltage, program permit voltage and the program inhibit voltage may be various according to the characteristics of the OTP memory cells and the configuration of the OTP memory device.

In the program mode, the program voltage may be applied to the voltage line VL and the access transistor TR may be turned-on, and thus the second filling layer 324 between the third impurity region 335 and the second well 304, that is, the first anti-fuse AF1 may be broken down, so that the third impurity region 335 and the second well 304 may be short to have a low resistance.

In a read mode (or a read operation), a read voltage having a voltage level lower than the program voltage may be applied to the voltage line VL, and a selection voltage having a voltage level higher than the voltage level that may turn on the access transistor TR according to the row address RADDR, that is, the threshold voltage of the access transistor TR may be applied to the word line WL. In an example embodiment, the read voltage may be lower than the breakdown voltage of the first anti-fuse AF1. A read permit voltage may be applied to one of the bit lines BL (i.e., a selected bit line BL) connected to one of OTP memory cells (i.e., a selected OTP memory cell) to be read, and a read inhibit voltage, which may be greater than the read permit voltage, may be applied to other ones of the bit lines BL (i.e., unselected bit lines BL) connected to other ones of the OTP memory cells (i.e., unselected OTP memory cells) not to be read. Thus, the programmed OTP memory cell may be sensed through the one of the bit lines BL to which the read permit voltage is applied.

For example, each of the read voltage and the selection voltage may be 1V and 3V, respectively, the read permit voltage may be a ground voltage or 0V, and the read inhibit voltage may be 1V. However, the inventive concept may not be limited thereto, and the read voltage, the selection voltage, read permit voltage and the read inhibit voltage may be various according to the characteristics of the OTP memory cells and the configuration of the OTP memory device.

As illustrated above, data may be programmed and read using the breakdown characteristics of the first anti-fuse AF1 connected to the source region of the access transistor TR in the OTP memory device, and two states including a first state that is not programmed and a second state that is programmed may be implemented so that one bit data may be stored.

Figure 4:
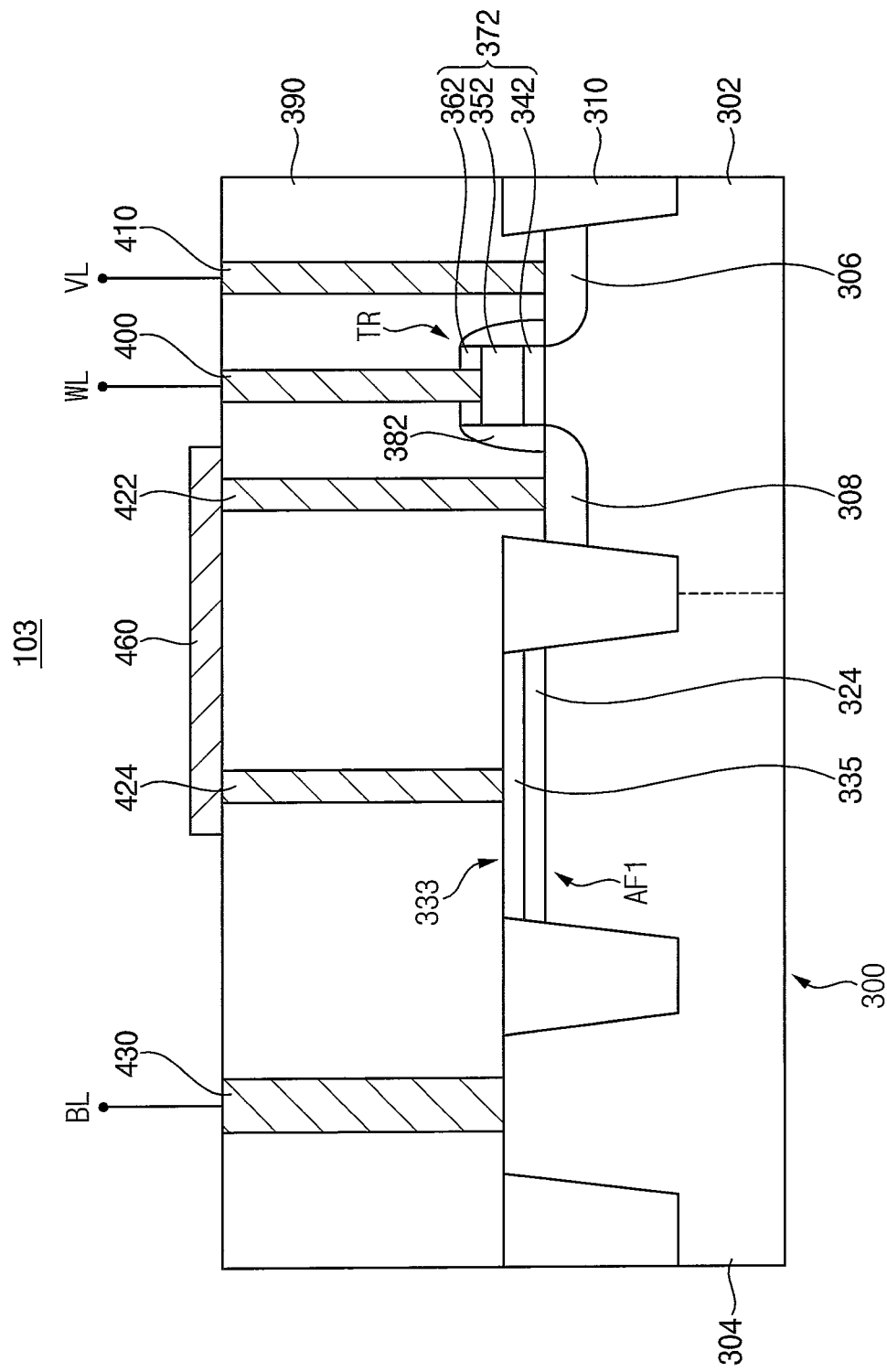
FIG. 4 is a cross-sectional view illustrating an OTP memory cell in accordance with example embodiments.

FIG. 4 is a cross-sectional view illustrating an OTP memory cell 103 in accordance with example embodiments. The OTP memory cell 103 may be a part of the OTP memory cell array included in the cell array circuit 100 illustrated with reference to FIG. 1, and may be the same as or similar to the OTP memory cell 101 of FIG. 2, except for the access transistor TR.

Referring to FIG. 4, the first gate structure 372 included in the access transistor TR may contact an upper surface of the first well 302 of the substrate 300, and the first filling oxide layer 322 and the first semiconductor layer 331 shown in FIG. 2 may not be formed between the first well 302 and the first gate structure 372.

In an embodiment, fourth and fifth impurity regions 306 and 308 may be formed at upper portions of the first well 302 adjacent to the first gate structure 372, and each of the fourth and fifth impurity regions 306 and 308 may serve as a source/drain region of the access transistor TR. Each of the fourth and fifth impurity regions 306 and 308 may be doped with impurities having the same conductivity type as the impurities doped in the second well 304, that is, n-type impurities.

The second and third contact plugs 410 and 422 may contact upper surfaces of the fourth and fifth impurity regions 306 and 308, respectively.

In the OTP memory cell 101 illustrated with reference to FIG. 2, the access transistor TR may be formed on the SOI substrate. In the OTP memory cell 103 illustrated with reference to FIG. 4, the access transistor TR may be formed on a bulk substrate. However, the method of storing one bit data using the breakdown characteristics of the first anti-fuse AF1 may be the same as each other.

Figure 5:
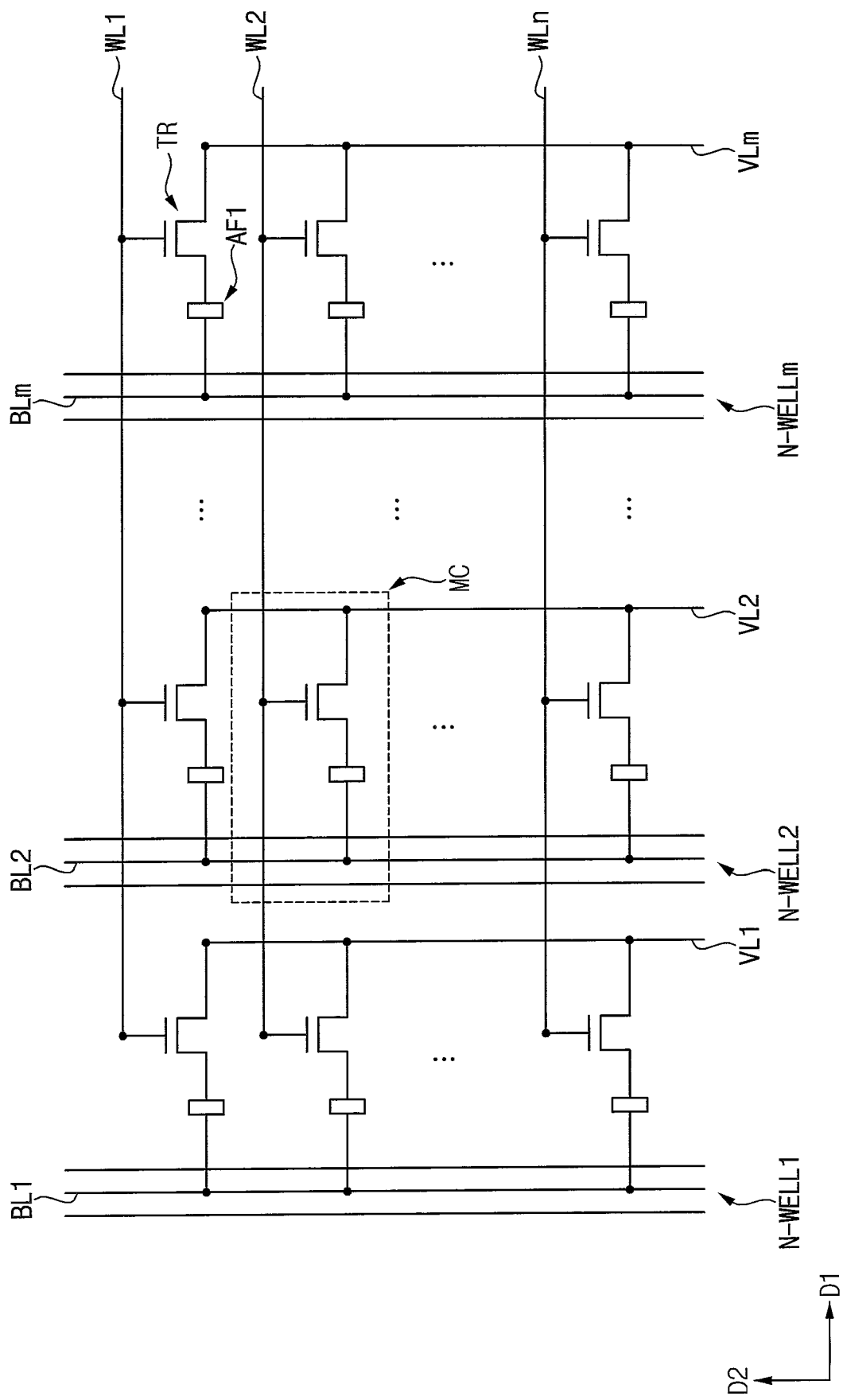
FIG. 5 is a circuit diagram illustrating an OTP memory cell array in accordance with example embodiments.

FIG. 5 is a circuit diagram illustrating an OTP memory cell array in accordance with example embodiments. The OTP memory cell array be a part of the cell array circuit 100 included in the OTP memory device 50 of FIG. 1.

Referring to FIG. 5, the OTP memory cell array may include a plurality of OTP memory cells MC arranged in an n×m matrix pattern (each of n and m is an integer), which may be connected to a plurality of word lines WL1, . . . , and WLn, a plurality of voltage lines VL1, . . . , and VLm, and a plurality of bit lines BL1, . . . , and BLm. The plurality of bit lines BL1, . . . , and BLm may be electrically connected to a plurality of second wells N-WELL1, and N-WELLm, respectively. Each of the OTP memory cells MC may include one of the OTP memory cell 101 and the OTP memory cell 103.

In example embodiments, each of the plurality of word lines WL1, . . . , and WLn may extend in a first direction D1 parallel to an upper surface of the substrate 300 (refer to FIG. 2). The plurality of word lines WL1, . . . , and WLn may be arranged in a second direction D2 parallel to the upper surface of the substrate 300 and crossing the first direction D1. Additionally, each of the plurality of voltage lines VL1, . . . , and VLm and each of the plurality of bit lines BL1, . . . , and BLm may extend in the second direction D2. The plurality of voltage lines VL1, . . . , and VLm may be arranged in the first direction D1, and the plurality of bit lines BL1, . . . , and BLm may be arranged in the first direction D1. In example embodiments, the first and second directions D1 and D2 may be perpendicular to each other.

In each of the OTP memory cells MC, a gate of the access transistor TR may be connected to a corresponding word line WLx (x is an integer equal to or less than n), a drain region of the access transistor TR may be connected to a corresponding voltage line VLy (y is an integer equal to or less than m), and a source region of the access transistor TR may be connected to a corresponding bit line BLy (y is an integer equal to or less than m) through the first anti-fuse AF1. The bit line BLy may be electrically connected to a corresponding second well N-WELLy.

Figure 6:
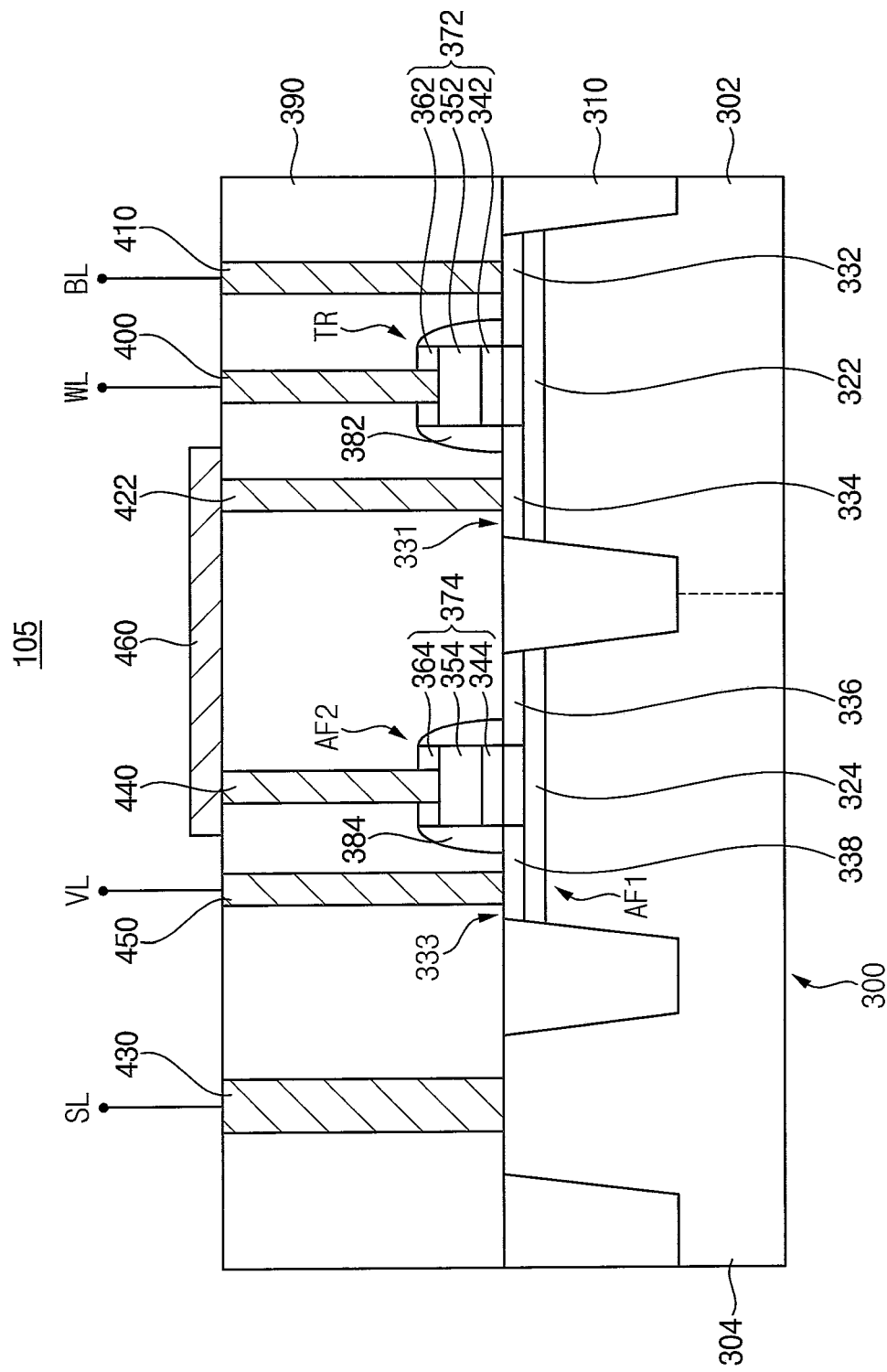
FIG. 6 is a cross-sectional view illustrating an OTP memory cell in accordance with example embodiments.
Figure 7:
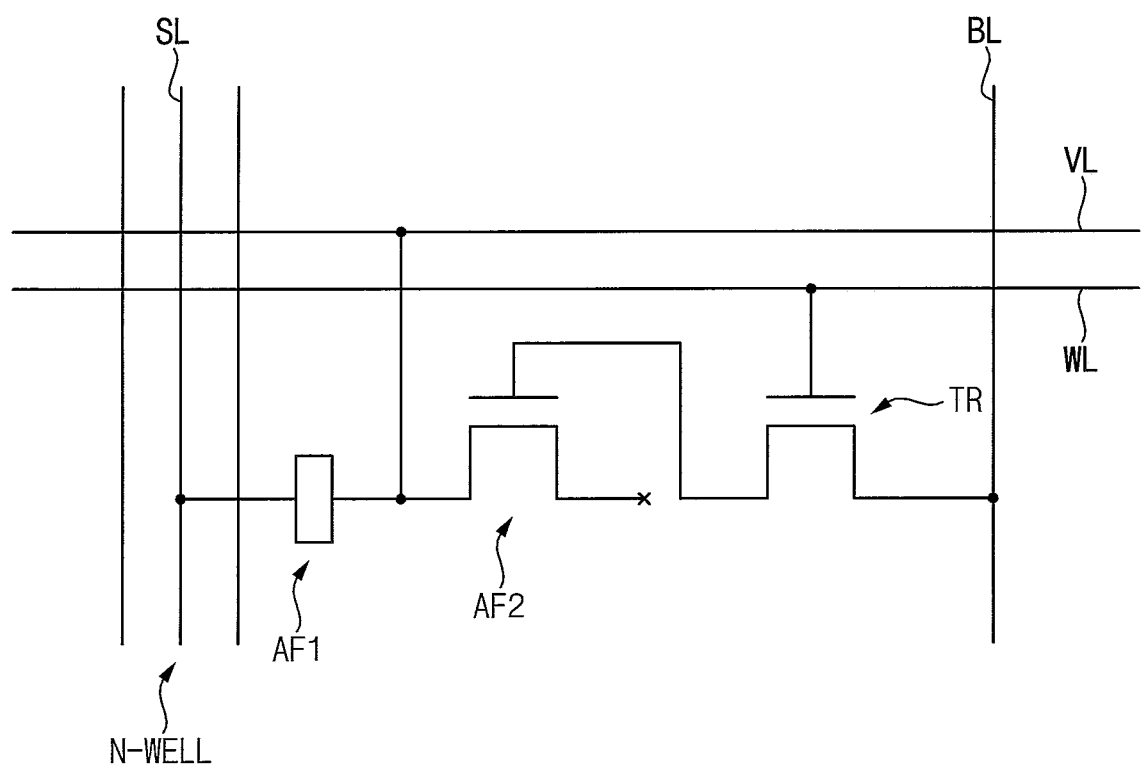
FIG. 7 is a circuit diagram illustrating an electrical connection relationship and an operating method of the OPT memory cell in accordance with example embodiments.

FIG. 6 is a cross-sectional view illustrating an OTP memory cell 105 in accordance with example embodiments, and FIG. 7 is a circuit diagram illustrating an electrical connection relationship and an operating method of the OPT memory cell 105 in accordance with example embodiments.

The OTP memory cell 105 may be a part of the OTP memory cell array included in the cell array circuit 100 illustrated with reference to FIG. 1.

The OTP memory cell 105 of FIG. 6 may be the same as or similar to that of FIG. 2, except that the OTP memory cell further includes a second anti-fuse AF2.

Referring to FIG. 6, the OTP memory cell 105 may include the access transistor TR and the first and second anti-fuses AF1 and AF2 on the substrate 300.

The second filling oxide layer 324 and the second semiconductor layer 333 may be stacked on a portion of the second well 304 of the substrate 300, and the second anti-fuse AF2 may include the second semiconductor layer 333 and the second gate structure 374.

The second gate structure 374 may include a second gate insulation pattern 344, a second gate electrode 354 and a second gate mask 364 sequentially stacked, and a second spacer 384 may be formed on a sidewall of the second gate structure 374.

In example embodiments, the second gate insulation pattern 344 may have a thickness similar to or same as a thickness of each of the first and second filling oxide layers 322 and 324, however, the inventive concept may not be limited thereto. For example, the thickness of the second gate insulation pattern 344 may be different from the thickness of each of the first and second filling oxide layers 322 and 324.

Sixth and seventh impurity regions 336 and 338 may be formed at portions of the second semiconductor layer 333 opposite sides of the second gate structure 374, respectively, which may be doped with impurities having the same conductivity type as the impurities of the second well 304, that is, n-type impurities, and each of the sixth and seventh impurity regions 336 and 338 may serve as a source/drain region of the second anti-fuse AF2.

The fourth contact plug 424 among the first to fifth contact plugs 400, 410, 422, 424 and 430 shown in FIG. 2 may not be formed, and a sixth contact plug 440 extending through the insulating interlayer 390 and the second gate mask 364 to contact an upper surface of the second gate electrode 354, and a seventh contact plug 450 extending through the insulating interlayer 390 to contact an upper surface of the seventh impurity region 338 may be further formed. The wiring line 460 may commonly contact upper surfaces of the third and sixth contact plugs 422 and 440, so that the third and sixth contact plugs 422 and 440 may be electrically connected to each other.

Each of the sixth and seventh contact plugs 440 and 450 may be formed of or include a conductive material, e.g., a metal, a metal nitride, a metal silicide and/or doped polysilicon.

Referring to FIGS. 6 and 7, the first contact plug 400 contacting the first gate electrode 352 may be electrically connected to the word line WL, the second contact plug 410 contacting the first impurity region 332 may be electrically connected to the bit line BL, and the fifth contact plug 430 contacting the second well 304 may be electrically connected to a sensing line SL. Additionally, the third contact plug 422 contacting the second impurity region 334 may be electrically connected to the second gate electrode 354 through the wiring line 460 and the sixth contact plug 440, and the seventh contact plug 450 contacting the seventh impurity region 338 may be electrically connected to the voltage line VL.

For example, the first gate electrode 352 of the access transistor TR may be connected to the word line WL, the drain region 332 of the access transistor TR may be connected to the bit line BL. Additionally, the source region 334 of the access transistor TR may be connected to the second gate electrode 354 of the second anti-fuse AF2, the drain region 338 of the second anti-fuse AF2 may be connected to the voltage line VL, and the source region 336 of the second anti-fuse AF2 may be electrically floated. The seventh impurity region 338 and the second well 304 may be connected to each other through the first anti-fuse AF1, and the second well 304 may be connected to the sensing line SL.

Hereinafter, the operation method of the OTP memory cell 105 will be illustrated.

A case in which the second gate insulation pattern 344 included in the second anti-fuse AF2 and the second filling oxide layer 324 included in the first anti-fuse AF1 have the same breakdown voltage will be explained.

In a first program mode, a program voltage having a voltage level higher than breakdown voltages of the second gate insulation pattern 344 and the second filling oxide layer 324 may be applied to the voltage line VL, and a selection voltage having a voltage level higher than a threshold voltage of the access transistor TR may be applied to the word line WL. A program permit voltage may be applied to one of the bit lines BL (i.e., a selected bit line BL) connected to one of OTP memory cells (i.e., a selected OTP memory cell) to be programmed, and a first program inhibit voltage higher than the program permit voltage may be applied to other ones of the bit lines BL (i.e., unselected bit lines BL) connected to other ones of the OTP memory cells (i.e., unselected OTP memory cells) not to be programmed. A second program inhibit voltage higher than the program permit voltage may be applied to one of the sensing lines SL (i.e., a selected sensing line SL) connected to the one of the OTP memory cells (i.e., the selected OTP memory cell) to be programmed, and a third program inhibit voltage higher than the program permit voltage may be applied to other ones of the sensing lines SL (i.e., unselected sensing lines SL) connected to the other ones of the OTP memory cells (i.e., unselected OTP memory cells) not to be programmed.

In an example embodiment, the second program inhibit voltage may be greater than the first and third program inhibit voltages, and the first and third program inhibit voltages may be the same as or different from each other.

In the first program mode, for example, each of the program voltage and the selection voltage may be 3V, the program permit voltage may be a ground voltage or 0V, and the first to third program inhibit voltages may be 1.5V, 3V and 1.5V, respectively. However, the program voltage, the selection voltage, the program permit voltage, and the first to third program voltages may be various according to the characteristics of the OTP memory cells and the configuration of the OTP memory device.

In the first program mode, the program voltage may be applied to the voltage line VL and the access transistor TR may be turned-on, and thus the second gate insulation pattern 344 included in the second anti-fuse AF2 may be broken down, so that the second anti-fuse AF2 may be short to have a low resistance, which may implement the second state in which the second anti-fuse AF2 is programmed.

In a second program mode, a program voltage having a voltage level higher than the breakdown voltages of the second gate insulation pattern 344 and the second filling oxide layer 324 may be applied to the voltage line VL, and a selection voltage having a voltage level higher than the threshold voltage of the access transistor TR may be applied to the word line WL. A program permit voltage may be applied to one of the sensing lines SL (i.e., a selected sensing line SL) connected to one of OTP memory cells (i.e., a selected OTP memory cell) to be programmed, and a fourth program inhibit voltage higher than the program permit voltage may be applied to other ones of the sensing lines SL (i.e., unselected sensing lines SL) connected to other ones of the OTP memory cells (i.e., unselected OTP memory cells) not to be programmed. A fifth program inhibit voltage higher than the program permit voltage may be applied to one of the bit lines BL (i.e., a selected bit line BL) connected to the one of the OTP memory cells (i.e., the selected OTP memory cell) to be programmed, and a sixth program inhibit voltage higher than the program permit voltage may be applied to other ones of the bit lines BL (i.e., unselected bit lines BL) connected to the other ones of the OTP memory cells (i.e., unselected OTP memory cells) not to be programmed.

In an example embodiment, the fifth program inhibit voltage may be greater than the fourth and sixth inhibit voltages, and the fourth and sixth program inhibit voltages may be the same as or different from each other.

In the second program mode, for example, each of the program voltage and the selection voltage may be 3V, the program permit voltage may be a ground voltage or 0V, and the fourth to sixth program inhibit voltages may be 1.5V, 3V and 1.5V, respectively. However, the program voltage, the selection voltage, the program permit voltage, and the fourth to sixth program voltages may be various according to the characteristics of the OTP memory cells and the configuration of the OTP memory device.

In the second program mode, the program voltage may be applied to the voltage line VL and the access transistor TR may be turned-on, and thus the second filling oxide layer 324 included in the first anti-fuse AF1 may be broken down, so that the first anti-fuse AF1 may be short to have a low resistance, which may implement a third state in which the first anti-fuse AF1 is programmed.

In a third program mode, a program voltage having a voltage level higher than the breakdown voltages of the second gate insulation pattern 344 and the second filling oxide layer 324 may be applied to the voltage line VL, and a selection voltage having a voltage level higher than the threshold voltage of the access transistor TR may be applied to the word line WL. A program permit voltage may be applied to one of the sensing lines SL and one of the bit lines BL (i.e., a selected bit line BL) connected to one of OTP memory cells (i.e., a selected OTP memory cell) to be programmed, and seventh and eighth program inhibit voltages higher than the program permit voltage may be applied to other ones of the bit lines BL (i.e., unselected bit lines BL) and the sensing lines SL (i.e., unselected sensing lines SL), respectively, connected to other ones of the OTP memory cells (i.e., unselected OTP memory cells) not to be programmed.

In an example embodiment, the seventh and eighth program inhibit voltages may be the same as or different from each other.

In the third program mode, for example, each of the program voltage and the selection voltage may be 3V, the program permit voltage may be a ground voltage or 0V, and each of the seventh and eighth program inhibit voltages may be 1.5V. However, the program voltage, the selection voltage, the program permit voltage, and the seventh and eighth program voltages may be various according to the characteristics of the OTP memory cells and the configuration of the OTP memory device.

In the third program mode, the program voltage may be applied to the voltage line VL and the access transistor TR may be turned-on, and thus the second filling oxide layer 324 included in the first anti-fuse AF1 and the second filling oxide layer 344 included in the second anti-fuse AF2 may be broken down, so that the first and second anti-fuses AF1 and AF2 may be short to have a low resistance, which may implement a fourth state in which the first and second anti-fuses AF1 and AF2 are programmed. In consideration of the breakdown of the first and second anti-fuses AF1 and AF2, timing of the operation voltages applied to the bit line BL and the sensing line SL may be adjusted.

In a read mode, a read voltage having a voltage level lower than the program voltage may be applied to the voltage line VL, a selection voltage having a voltage level higher than the threshold voltage of the access transistor TR may be applied to the word line WL. In an example embodiment, the read voltage may be lower than the breakdown voltages of the first and second anti-fuses AF1 and AF2. A read permit voltage may be applied to one of the bit lines BL (i.e., a selected bit line BL) and one of the sensing lines SL (i.e., a selected sensing line SL) connected to one of the OTP memory cells (i.e., a selected OTP memory cell) to be read, and a read inhibit voltage may be applied to other ones of the bit lines BL (i.e., unselected bit lines BL) and other ones of the sensing lines SL (i.e., unselected sensing lines SL) connected to other ones of the OTP memory cells (i.e., unselected OTP memory cells) not to be read. Thus, the programmed or non-programmed OTP memory cell may be sensed through the one of the bit lines BL and the one of the sensing lines SL to which the read permit voltage is applied.

In the read mode, for example, the read voltage and the selection voltage may be 1V and 3V, respectively, the read permit voltage may be a ground voltage or 0V, and the read inhibit voltage may be 1V. However, the inventive concept may not be limited thereto, and the read voltage, the selection voltage, the read permit voltage, and the read inhibit voltage may be various according to the characteristics of the OTP memory cell and the configuration of the OTP memory device.

As illustrated above, in the OTP memory device 105, data may be programmed and read using the breakdown characteristics of the second filling oxide layer 324 and the second gate insulation pattern 344 included in the first and second anti-fuses AF1 and AF2, respectively. For example, the first state in which no OTP memory cells are programmed, and the second to fourth states in which one or both of the first and second anti-fuses AF1 and AF2 are programmed may be implemented, so that two-bit data may be stored.

A case in which the second gate insulation pattern 344 included in the second anti-fuse AF2 and the second filling oxide layer 324 included in the first anti-fuse AF1 have different breakdown voltages will be explained. In this case, a thickness of the second gate insulation pattern 344 may be different from a thickness of the second filling oxide layer 324. Hereinafter, only a case in which the breakdown voltage of the second filling oxide layer 324 is greater than the breakdown voltage of the second gate insulation pattern 344 will be explained. In this case, a thickness of the second filling oxide layer 324 may be greater than a thickness of the second gate insulation pattern 344. However, the inventive concept may not be limited thereto. For example, a thickness of the second gate insulation pattern 344 may be greater than a thickness of the second filling oxide layer 324 such that the breakdown voltage of the second gate insulation pattern 344 may be greater than the breakdown voltage of the second filling oxide layer 324.

In the first program mode, a first program voltage having a voltage level higher than a breakdown voltage of the second gate insulation pattern 344 and lower than a breakdown voltage of the second filling oxide layer 324 may be applied to the voltage line VL, and a selection voltage having a voltage level higher than the threshold voltage of the access transistor TR may be applied to the word line WL. A program permit voltage may be applied to one of the bit lines BL (i.e., a selected bit line BL) connected to one of OTP memory cells (i.e., a selected OTP memory cell) to be programmed, and a ninth program inhibit voltage higher than the program permit voltage may be applied to other ones of the bit lines BL (i.e., unselected bit lines BL) connected to other ones of the OTP memory cells (i.e., unselected OTP memory cells) not to be programmed. The program permit voltage or a tenth program inhibit voltage higher than the program permit voltage may be applied to one of the sensing lines SL (i.e., a selected sensing line SL) connected to the one of the OTP memory cells (i.e., the selected OTP memory cell) to be programmed, and an eleventh program inhibit voltage higher than the program permit voltage may be applied to other ones of the sensing lines SL (i.e., unselected sensing lines SL) connected to the other ones of the OTP memory cells (i.e., unselected OTP memory cells) not to be programmed.

In the first program mode, for example, the first program voltage and the selection voltage may be 3V and 6V, respectively, the program permit voltage may be a ground voltage or 0V, and the ninth to eleventh program inhibit voltages may be 4.2V, 3V and 3V, respectively. However, the first program voltage, the selection voltage, the program permit voltage, and the ninth to eleventh program inhibit voltages may be various according to the characteristics of the OTP memory cells and the configuration of the OTP memory device.

In the first program mode, the first program voltage may be applied to the voltage line VL and the access transistor TR may be turned-on, and thus the second gate insulation pattern 344 included in the second anti-fuse AF2 may be broken down, so that the second anti-fuse AF2 may be short to have a low resistance, which may implement the second state in which the second anti-fuse AF2 is programmed.

In the second program mode, a second program voltage having a voltage level higher than the breakdown voltages of the second gate insulation pattern 344 and the second filling oxide layer 324 may be applied to the voltage line VL, and a selection voltage having a voltage level higher than the threshold voltage of the access transistor TR may be applied to the word line WL. A program permit voltage may be applied to one of the sensing lines SL (i.e., a selected sensing line SL) connected to one of OTP memory cells (i.e., a selected OTP memory cell) to be programmed, and a twelfth program inhibit voltage higher than the program permit voltage may be applied to other ones of the sensing lines SL (i.e., unselected sensing lines SL) connected to other ones of the OTP memory cells (i.e., unselected OTP memory cells) not to be programmed. A thirteenth program inhibit voltage higher than the program permit voltage may be applied to one of the bit lines BL (i.e., a selected bit line BL) connected to the one of the OTP memory cells (i.e., the selected OTP memory cell) to be programmed, and a fourteenth program inhibit voltage higher than the program permit voltage may be applied to other ones of the bit lines BL (i.e., unselected bit lines BL) connected to the other ones of the OTP memory cells (i.e., the unselected OTP memory cells) not to be programmed.

In an example embodiment, the thirteenth program inhibit voltage may be greater than each of the twelfth and fourteenth inhibit voltages, and the twelfth and fourteenth program inhibit voltages may be the same as or different from each other.

In the second program mode, for example, the second program voltage and the selection voltage may be 6V, the program permit voltage may be a ground voltage or 0V, and the twelfth to fourteenth program inhibit voltages may be 3V, 6V and 4.2V, respectively. However, the second program voltage, the selection voltage, the program permit voltage, and the twelfth to fourteenth program voltages may be various according to the characteristics of the OTP memory cells and the configuration of the OTP memory device.

In the second program mode, the second program voltage may be applied to the voltage line VL and the access transistor TR may be turned-on, and thus the second filling oxide layer 324 included in the first anti-fuse AF1 may be broken down, so that the first anti-fuse AF1 may be short to have a low resistance, which may implement the third state in which the first anti-fuse AF1 is programmed.

In the third program mode, the second program voltage may be applied to the voltage line VL, and a selection voltage having a voltage level higher than the threshold voltage of the access transistor TR may be applied to the word line WL. A program permit voltage may be applied to one of the sensing lines SL (i.e., a selected sensing line SL) and one of the bit lines BL (i.e., a selected bit line BL) connected to one of OTP memory cells (i.e., a selected OTP memory cell) to be programmed, and fifteenth and sixteenth program inhibit voltages higher than the program permit voltage may be applied to other ones of the bit lines BL (i.e., unselected bit lines BL) and the sensing lines SL (i.e., unselected sensing lines SL), respectively, connected to other ones of the OTP memory cells (i.e., unselected OTP memory cells) not to be programmed.

In an example embodiment, the fifteenth and sixteenth program inhibit voltages may be the same as or different from each other.

In the third program mode, for example, each of the second program voltage and the selection voltage may be 6V, the program permit voltage may be a ground voltage or 0V, and the fifteenth and sixteenth program inhibit voltages may be 4.2V and 3V, respectively. However, the second program voltage, the selection voltage, the program permit voltage, and the fifteenth and sixteenth program voltages may be various according to the characteristics of the OTP memory cells and the configuration of the OTP memory device.

In the third program mode, the second program voltage may be applied to the voltage line VL and the access transistor TR may be turned-on, and thus the second filling oxide layer 324 included in the first anti-fuse AF1 and the second filling oxide layer 344 included in the second anti-fuse AF2 may be broken down, so that the first and second anti-fuses AF1 and AF2 may be short to have a low resistance, which may implement the fourth state in which the first and second anti-fuses AF1 and AF2 are programmed. In consideration of the breakdown of the first and second anti-fuses AF1 and AF2, timing of the operation voltages applied to the bit line BL and the sensing line SL may be adjusted.

In a read mode, the operation voltages applied to the VL, WL, BL and SL may be the same as those in the read mode in which the first and second anti-fuses AF1 and AF2 have the same breakdown voltage. In an example embodiment, the read voltage used in the read mode may be less than a lower one of the breakdown voltages of the first and second anti-fuses AF1 and AF2.

Figure 8:
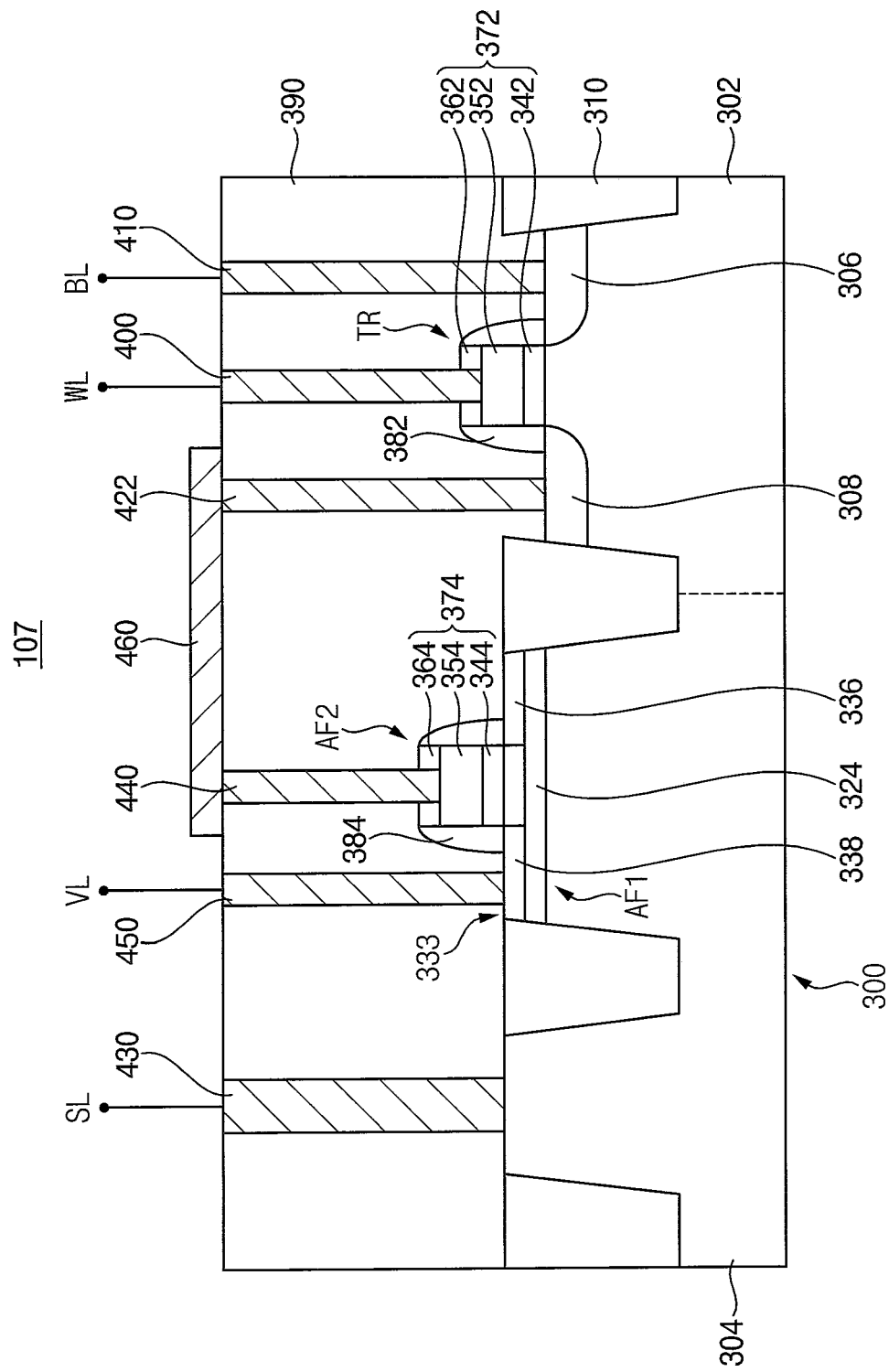
FIG. 8 is a cross-sectional view illustrating an OTP memory cell in accordance with example embodiments.

FIG. 8 is a cross-sectional view illustrating an OTP memory cell 107 in accordance with example embodiments. The OTP memory cell 107 may be a part of the OTP memory cell array included in the cell array circuit 100 illustrated with reference to FIG. 1, and may be the same as or similar to that of FIG. 6, except for the access transistor TR.

The access transistor TR is formed on an SOI substrate in the OTP memory cell illustrated with reference to FIG. 6, while the access transistor TR in the OTP memory cell illustrated with reference to FIG. 8 may be formed on a bulk substrate. For example, the method of storing two-bit data in the OTP memory cells may be the same.

Figure 9:
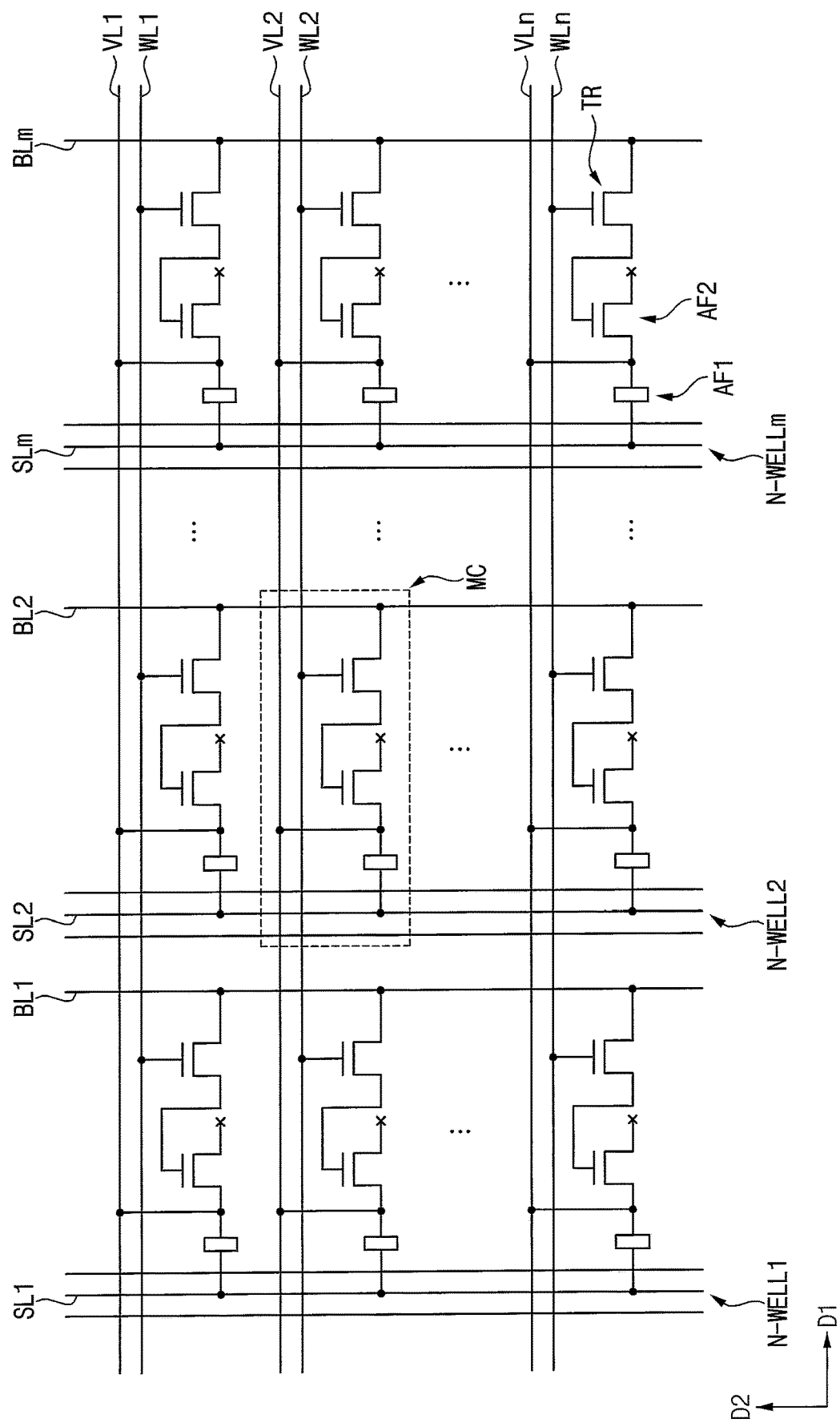
FIG. 9 is a circuit diagram illustrating an OTP memory cell array in accordance with example embodiments.

FIG. 9 is a circuit diagram illustrating an OTP memory cell array in accordance with example embodiments. The OTP memory cell array be a part of the cell array circuit 100 included in the OTP memory device 50 of FIG. 1.

Referring to FIG. 9, the OTP memory cell array may include a plurality of OTP memory cells MC arranged in an n×m matrix pattern (each of n and m is an integer), which may be connected to a plurality of word lines WL1, . . . , and WLn, a plurality of voltage lines VL1, . . . , and VLm, a plurality of bit lines BL1, . . . , and BLm, and a plurality of sensing lines SL1, . . . , and SLm. The plurality of sensing lines SL1, . . . , and SLm may be electrically connected to a plurality of second wells N-WELL1, . . . , and N-WELLm, respectively. Each of the OTP memory cells MC may include one of the OTP memory cell 105 and the OTP memory cell 107.

In example embodiments, each of the plurality of word lines WL1, . . . , and WLn and each of the plurality of voltage lines VL1, . . . , and VLn may extend in a first direction D1 parallel to an upper surface of the substrate 300 (refer to FIG. 6). The plurality of word lines WL1, . . . , and WLn may be arranged in a second direction D2 parallel to the upper surface of the substrate 300 and crossing the first direction D1 and the plurality of voltage lines VL1, and VLn may be arranged in the second direction D2. Additionally, each of the plurality of bit lines BL1, . . . , and BLm and each of the plurality of sensing lines SL1, . . . , and SLm may extend in the second direction D2. The plurality of bit lines BL1, . . . , and BLm may be arranged in the first direction D1, and the plurality of sensing lines SL1, . . . , and SLm may be arranged in the first direction D1. In example embodiments, the first and second directions D1 and D2 may be perpendicular to each other.

In each of the OTP memory cells MC, a gate of the access transistor TR may be connected to a corresponding word line WLx (x is an integer equal to or less than n), a drain region of the access transistor TR may be connected to a corresponding bit line BLy (y is an integer equal to or less than m), and a drain region of the second anti-fuse AF2 may be connected to a corresponding voltage line VLx and also may be connected to a corresponding sensing line SLy through the first anti-fuse AF1. A source region of the second anti-fuse AF2 may be electrically floated. The sensing line SLy may be electrically connected to a corresponding second well N-WELLy.

As illustrated above, in the OTP memory device in accordance with example embodiments, the second filling oxide layer 324 on the second well 304 may serve as the first anti-fuse AF1, and thus more data may stored when compared to the conventional OTP memory device in which only the second anti-fuse AF2 is used, so that the OTP memory device may have enhanced integration degree.

The inventive concept as described above may be applied to apparatuses and systems using OTP memory devices for storing nonvolatile data. For example, exemplary embodiments of the inventive concept may be applied to systems such as a mobile phone, a smart phone, a personal digital assistant (PDA), a portable multimedia player (PMP), a digital camera, a camcorder, a personal computer (PC), a server computer, a workstation, a laptop computer, a digital television (TV), a set-top box, a portable game console, etc.

While the inventive concept has been shown and described with reference to exemplary embodiments thereof, it will be apparent to those of ordinary skill in the art that various modifications in form and details may be made thereto without departing from the spirit and scope of the inventive concept as set forth by the following claims.

What is claimed is:

1. A one-time programmable (OTP) memory device, comprising:
    an access transistor including:
        a gate structure on a substrate; and
        first and second impurity regions at respective portions of the substrate adjacent to the gate structure;
    a word line electrically connected to the gate structure;
    a voltage line directly connected to the first impurity region;
    a first well at an upper portion of the substrate, the first well being doped with impurities having a first conductivity type;
    a first filling oxide layer on the first well;
    a first semiconductor layer on the first filling oxide layer, the first semiconductor layer being doped with impurities having the first conductivity type and electrically connected to the second impurity region; and
    a bit line electrically connected to the first well.

2. The OTP memory device of claim 1, wherein the first conductivity type is an n-type.

3. The OTP memory device of claim 1, wherein each of the first and second impurity regions includes impurities having the first conductivity type.

4. The OTP memory device of claim 1, further comprising:
    a second well at an upper portion of the substrate, the second well being doped with impurities having a second conductivity type different from the first conductivity type,
    wherein the access transistor is formed on the second well.

5. The OTP memory device of claim 4, further comprising:
a second filling oxide layer on the second well; and
a second semiconductor layer on the second filling oxide layer,
wherein the first and second impurity regions are formed in the second semiconductor layer, and
wherein the gate structure contacts an upper surface of the second semiconductor layer.

6. The OTP memory device of claim 1, further comprising:
a first contact plug electrically connected to the gate structure and the word line, and disposed between the gate structure and the word line;
a second contact plug electrically connected to the first impurity region and the voltage line, and disposed between the first impurity region and the voltage line; and
a third contact plug electrically connected to the first well and the bit line, and disposed between the first well and the bit line.

7. The OTP memory device of claim 1, wherein:
the access transistor, the first well, the first filling oxide layer and the first semiconductor layer form an OTP memory cell,
the word line extends in a first direction parallel to an upper surface of the substrate,
the voltage line and the bit line extend in a second direction parallel to the upper surface of the substrate and crossing the first direction, and
the OTP memory cell is one of a plurality of OTP memory cells arranged in a matrix pattern in the first and second directions.

8. The OTP memory device of claim 1, wherein, when a selection voltage higher than a threshold voltage of the access transistor is applied to the word line, a program voltage higher than a breakdown voltage of the first filling oxide layer is applied to the voltage line, and a program permit voltage is applied to the bit line, the first filling oxide layer is broken down such that the first well and the first semiconductor layer are electrically short with each other.

* * * * *